United States Patent [19]

Kahilainen

[11] Patent Number: 5,739,541

[45] Date of Patent: Apr. 14, 1998

[54] RADIATION DETECTOR

[75] Inventor: Jukka Kahilainen, Leechburg, Pa.

[73] Assignee: Rados Technology Oy, Turku, Finland

[21] Appl. No.: 637,739

[22] PCT Filed: Oct. 28, 1994

[86] PCT No.: PCT/FI94/00487

§ 371 Date: Jul. 1, 1996

§ 102(e) Date: Jul. 1, 1996

[87] PCT Pub. No.: WO95/12134

PCT Pub. Date: May 4, 1995

[30] Foreign Application Priority Data

Oct. 28, 1993 [FI] Finland ................... 934784

[51] Int. Cl.$^6$ .................... G01T 1/02; G01T 1/14
[52] U.S. Cl. .................. 250/370.07; 250/370.14; 250/374
[58] Field of Search ............ 250/370.01, 370.07, 250/370.14, 374, 375

[56] References Cited

U.S. PATENT DOCUMENTS

| | | | |
|---|---|---|---|
| 3,896,309 | 7/1975 | Halsor et al. | 250/370.14 X |
| 4,605,946 | 8/1986 | Robinson, Jr. | 250/370.14 X |
| 4,769,547 | 9/1988 | Uber, III | 250/370.07 X |
| 4,788,581 | 11/1988 | Knoll et al. | 250/370.07 X |
| 5,117,113 | 5/1992 | Thomson et al. | 250/370.14 X |
| 5,332,903 | 7/1994 | Buehler et al. | 250/370.14 |

*Primary Examiner*—Edward J. Glick
*Attorney, Agent, or Firm*—Kubovcik & Kubovcik

[57] ABSTRACT

A method for detecting ionizing radiation by allowing the radiation to affect the surface of the floating gate of a MOSFET transistor through an air or gas space. For this purpose, an uncovered area is formed on the surface of the floating gate of the MOSFET transistor forming the detector. The MOSFET transistor is used so that a charge is formed on its floating gate, the charge changing as a result of the ionizing radiation the transistor is exposed to. The radiation dose is determined by the change which takes place in the charge on the gate.

15 Claims, 4 Drawing Sheets

5,739,541

RADIATION DETECTOR

OBJECT OF THE INVENTION

The object of the invention is a method for detecting ionizing radiation by means of the type of dosimeter which incorporates a MOSFET transistor provided with a floating gate. Further objects of the invention are a dosimeter for implementing the method and the use of the MOSFET transistor for detecting ionizing radiation.

1. Aims

A device for detecting ionizing radiation can be required to have the following properties:

1. Simple structure.
2. Ability to operate as a "passive" detector, that is, without a power supply, in integrated radiation dose measurement.
3. Sufficient sensitivity (<1 mrem or 1 µSv) to enable use in personal and environmental radiation monitoring.
4. Sufficiently wide low-end energy range for detecting low-energy x-radiation and gamma-radiation, starting from 10 keV or a smaller value.
5. Ability to detect charged particles such as beta, proton and alpha particles, and neutrons, where the configuration surrounding the detector is suitable.
6. Non-destructive and directly readable electronic readout of dose/dose rate enabling the construction of direct-reading instruments.
7. Simple and low-cost readout method enabling the construction of pocket-size direct-reading dosimeters.

2. Prior Art

However, devices possessing the above properties are not known. According to the prior art, for example, the following devices can be used to detect ionizing radiation:

1. PHOTOLUMINESCENT GLASS DOSIMETER

The photoluminescent glass dosimeter meets most of the above-mentioned requirements, with the exception of the last concerning a simple and low-cost readout method. This is due to the face that currently used readout methods are based on high-precision UV-light sources which are combined with optical filters and fluorescence detectors for measuring fluorescent light when the material is subjected to UV-radiation. In addition, the material used in this method, that is, phosphate glass, is sensitive to environmental effects and requires great care in handling and in the measuring process.

2. CAPACITIVE DOSIMETER

The best known capacitive dosimeter is the so-called QFD (Quartz Fiber Dosimeter) which is also known as the PIC, or Pocket Ion Chamber. It combines a capacitive osimeter with an integrating electrometer, which the user can read by viewing the position of the fiber, that is, the deflection of the fiber. In principle, the capacitive dosimeter meets all the requirements set out above with the exception that it lacks a simple and non-destructive electronic readout method.

Electronic readout methods based on optically determining the position of the electrometer fiber have been developed earlier, but these methods have not functioned sufficiently well on the readout of a pocket-size device. Other capacitive dosimeters, including so-called electret dosimeters, also lack non-destructive readout methods.

3. MOS DOSIMETER

The MOS dosimeter is based on measuring the trapping of permanent charges, which cause the degradation of the insulating silicon dioxide layer in a MOSFET transistor caused by radiation. These devices meet all other requirements except that of sufficient sensitivity. They are, therefore, suited for measuring high doses, starting from about 1 rem or 10 mSv.

One known MOS dosimeter is disclosed in U.S. Pat. publication No. 4,788,581. In this dosimeter, there is a silicon oxide layer with a floating gate embedded in it on the silicon substrate, for collecting ion pairs from solid matter. Since the mobility of the ion pairs in solid matter is poor, a live gate is added on the floating gate to allow more effective collection of charges on the floating gate. This means that the area between the gates forms a radiation-sensitive area in this device.

Due to the structure of the dosimeter presented in U.S. Pat. publication No. 4,788,581, its sensitivity is poor. It is suitable for measuring radiation of an intensity of 1 rem or 10 mSv or higher. It is, therefore, unsuited for personal radiation monitoring, which would require a measuring sensitivity within the range of 1 µSv or 0.1 mrem.

The most common drawback of radiation measuring devices is that the effect of radiation is permanent, or at least 'quasi-permanent'. This means that the special treatment is required to reverse the effects of radiation in order for the devices to become re-usable. A general requirement is, however, that the radiation measurement device is electrically reversible.

BRIEF DESCRIPTION OF THE INVENTION

The aim of the present invention is to eliminate the above problem and to achieve a new method and device that do not have the foregoing drawbacks.

It is characteristic of the method relating to the invention that ionizing radiation is allowed to affect the surface of the floating gate of the MOSFET transistor through an open air or gas space or a closed air or gas space so that on the surface of the gate there is an uncovered area, or an area covered by a conductor, semiconductor or thin insulator.

The thickness of the insulator may not exceed, for example, 5 mm to still enable the passage of charges through it to the actual gate. Most preferably, however, a part of the surface of the gate is completely uncovered.

It is characteristic of the dosimeter relating to the invention that at least a part of the surface of the floating gate of the MOSFET transistor is uncovered, or covered by a conductor, semiconductor or thin insulator, and that the surface of the floating gate is located in an open air or gas space or closed air or gas space.

It is characteristics of the use of the MOSFET transistor relating to the invention for detecting ionizing radiation that a charge is formed on the floating gate of the MOSFET transistor, the charge changing as a result of the ionizing radiation to which the transistor is exposed, and that the radiation dose is determined by the change which takes place in the charge on the gate.

The invention is base don measuring the effect of ionizing radiation on an electric charge stored in the capacitance of the floating gate of a MOSFET, or Metal-Oxide-Silicon, transistor. It is known that the charge-retention properties of MOSFET devices provided with floating gates are excellent. They are, therefore, well suited for the construction of non-volatile memories, which include both digital and analog EPROM and EEPROM memories.

In a typical MOSFET memory cell, under "passive", that is, non-biased conditions, the effective radiation-sensitive volume consists mainly of the insulating oxide layer. This means that the volume of the radiation-sensitive substance is so small that these devices are not susceptible to ionizing radiation except at very high doses (>1 kRad).

The invention is, therefore, based on increasing the effective radiation-sensitive volume, for example, by introducing a small volume of gas into a space surrounded by relatively thick wall material, the space directly surrounding the gate of the MOSFET transistor in a MOSFET transistor provided with a floating gate. The purpose of the volume of gas and the wall material is to act as the effective volume of substance in which ionization takes place.

The electrons or positive ions that are formed in this volume of gas are collected by means of the gate, by the effect of the electric field surrounding the gate after it has first been charged to a suitable potential. The initial charging is accomplished in the conventional manner, for example, by applying the FN tunneling technique.

By measuring the conductivity of the transistor's drain-source channel, the amount of gate charge can be determined without destroying the charge itself. This is analogous to reading out the information stored in an analog EEPROM memory.

The overall sensitivity to radiation can be adjusted by increasing or decreasing the gate capacitance as desired by altering the MOSFET structure. External parallel capacitance can be used to decrease the sensitivity.

The energy response of the detector can be determined by the selection of a suitable gas, gas pressure, and the wall material surrounding the gas space. If the volume of the gas, gas pressure and the surrounding wall material are selected so as to be tissue-equivalent, the dosimetric response of the detector will closely match that of human tissue and enable a tissue-equivalent personal dosimeter to be constructed.

DRAWINGS

The invention is described in the following examples, with reference to the appended drawings in which FIG. 1 shows diagrammatically a sectional view of a detector relating to the invention.

FIG. 2 corresponds to FIG. 1 and shows a second embodiment of the detector.

FIG. 3 corresponds to FIG. 1 and shows a third embodiment of the detector.

FIG. 4 corresponds to FIG. 1 and shows a fourth embodiment of the detector.

FIG. 5 corresponds to FIG. 1 and shows a fifth embodiment of the detector.

FIG. 6 shows the radiation readout device of the detector of FIG. 5.

FIG. 7 shows a sixth embodiment of the detector.

The charge on the gate 13 may generally be either positive or negative, so long as it differs from the charge of the silicon substrate 18. If the transistor 10 is not exposed to ionizing radiation, the gate potential remains unchanged for a long time. The charge can escape from the gate 13 only through, or along the surface of, the insulating oxide layer 14.

Figure 1:
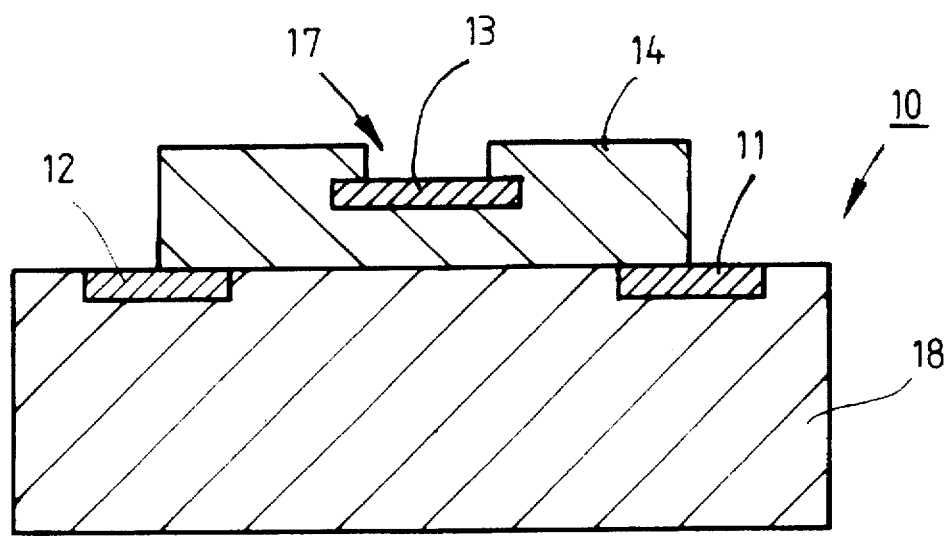
FIG. 1 shows diagrammatically a detector relating to the invention which at its simplest is only a MOSFET transitor 10. A charge is formed on the transistor 10 gate 13, for example, by applying a sufficiently high voltage between the source 11 and the drain 12. This causes the FN tunneling phenomenon to occur through the oxide layer of the gate insulator 14, causing the potential in the unconnected, that is, floating gate 13 to be set at the desired charge.

In the oxide layer insulator 14 of the floating gate 13 of the transistor 10 in FIG. 1, however, a hole 17 has been formed, through which the gate 13 is in direct contact with the surrounding air space. If the transistor 10 is exposed to ionizing radiation, the charge on the gate 13 creates an electric field which attracts the ions formed in the air space due to the effect of radiation. The ions are neutralized due to the effect of the charge on the gate 13, neutralizing at the same time the charge on the gate 13, that is, causing a change in the gate 13 potential. The radiation dose can then be determined on the basis of how much the gate 13 potential has changed.

Figure 2:
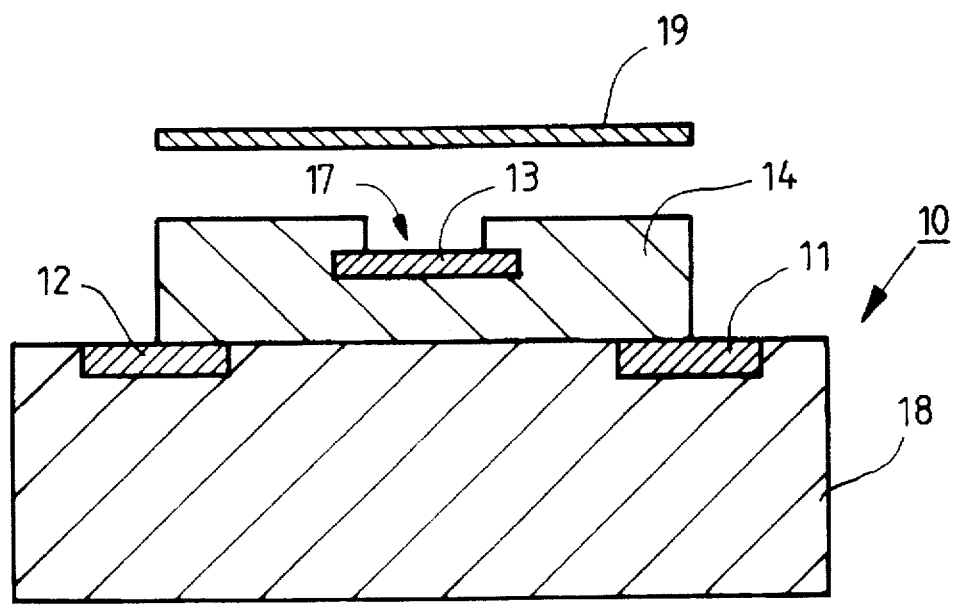

The transistor 10 in FIG. 2 corresponds otherwise to that shown in FIG. 1, but a plate 19 has been placed in front of the floating gate 13. Basically any solid substance is suitable for use in the plate. The plate does not necessarily have to be of metal, or even of conductive material. However, the plate 19 enables more effective generation of ions when the transistor 10 is exposed to ionizing radiation. Measuring efficiency is thus increased. The location and position of the plate 19 can also be made use of in order to increase measuring sensitivity in a particular direction.

Figure 3:
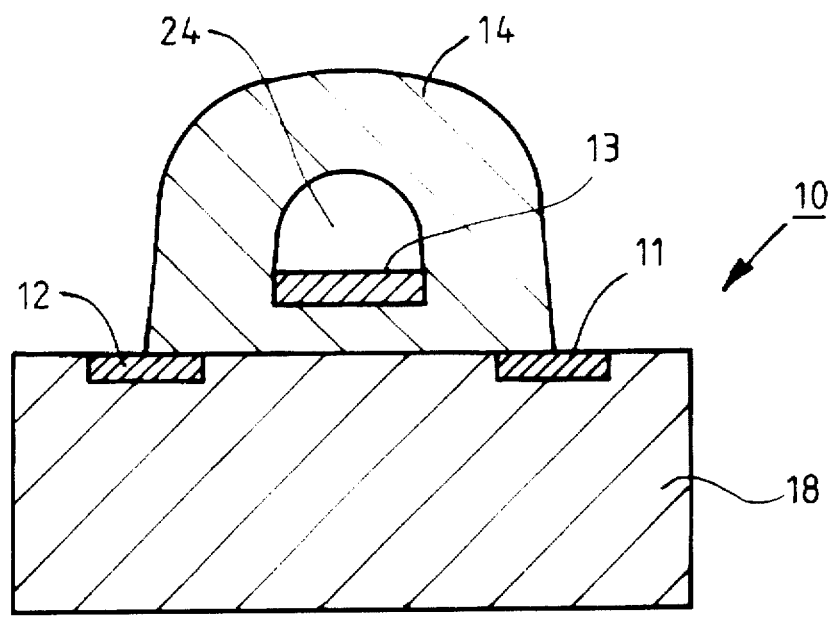

FIG. 3 shows a transistor 10, in which a closed air or gas space 24 is connected to the floating gate 13 by means of the oxide layer of the gate insulator 14. This space 24 further increases the formation of ions when the transistor is exposed to ionizing radiation. It can be said that an ionization chamber has been formed in conjunction with the floating gate 13 of the MOSFET transitor 10.

Figure 4:
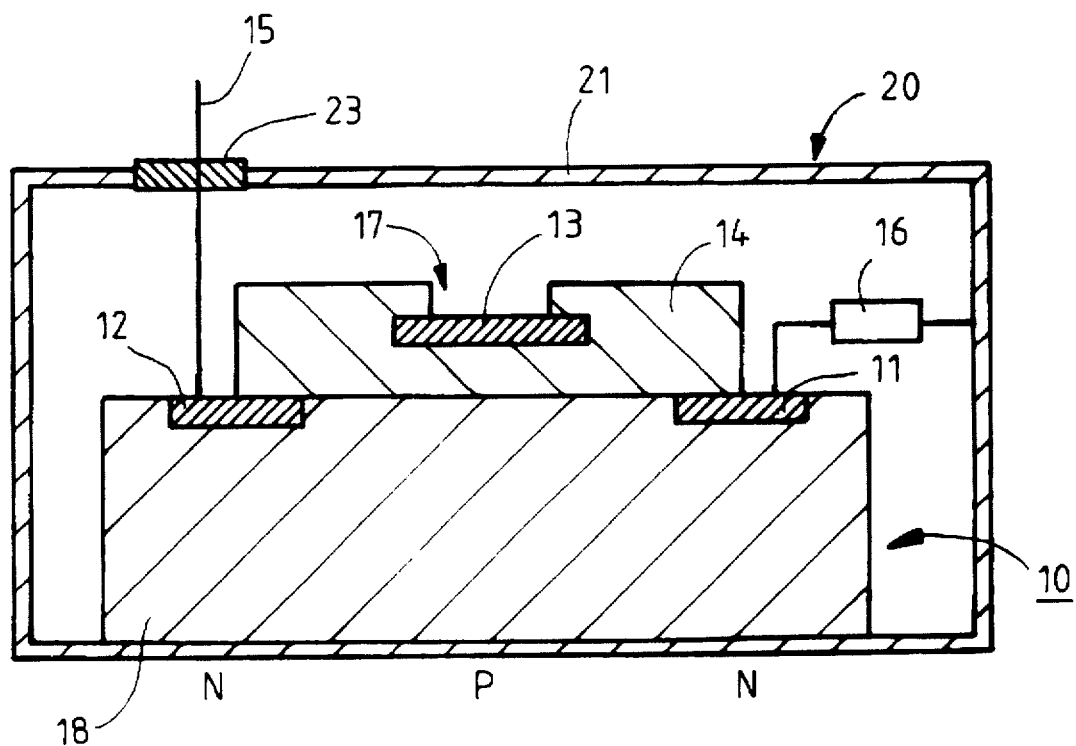

FIG. 4 shows a detector where an N-channel MOSFET transistor 10 is mounted in an air-filled chamber 20. The chamber is made of thin, for example, 0.5 mm thick, aluminium. The wall 21 of the chamber 20 is electrically connected to the source 11 of the transistor 10 through a current-limiting resistor 16. A conductor 15 is connected to the drain 12 of the transistor 10, which conductor is led through the wall 21 of the chamber 20 through an insulator 23. The transistor 10 gate 13 is left unconnected, that is, floating.

The gate 13 is charged, for example, by applying a sufficiently high voltage between the drain 12 and the wall 21, which causes the FN tunneling phenomenon to occur through the gate insulator 14, thus causing the gate potential to be set at a value of $V_g$. The initial conductivity is measured by applying a suitable voltage $V_{dd}$ between the drain 12 and the wall 21 and by measuring the resulting drain-source current $I_{ds1}$.

If the detector is not exposed to ionizing radiation, the gate potential will remain unchanged for a very long period of time, even for several years, because the charge can escape from the gate only through, or along the surface of, the insulating oxide layer 14.

If the chamber 20 is exposed to ionizing radiation, ion pairs are formed in the air space 24 inside the chamber 20. The ion pairs are attracted to the conductive wall 21 of the chamber 20 and are eventually neutralized by the effect of the electrons in the conductive wall 21. The positive charge on the gate 13 attracts the electrons which are eventually collected on the surface of the gate 13, thus neutralizing the charge on the gate 13. This causes the potential $V_g$ to decrease.

Conductivity is measured by introducing a suitable voltage $V_{dd}$ between the drain 12 and the wall 21, and by measuring the resulting drain-source current $I_{ds2}$. The integrated radiation dose can be determined by comparing the current $I_{ds2}$ measured after radiation with the initial current $I_{ds1}$. The current-radiation dose correlation can be determined by using a calibrated radiation source.

Figure 5:
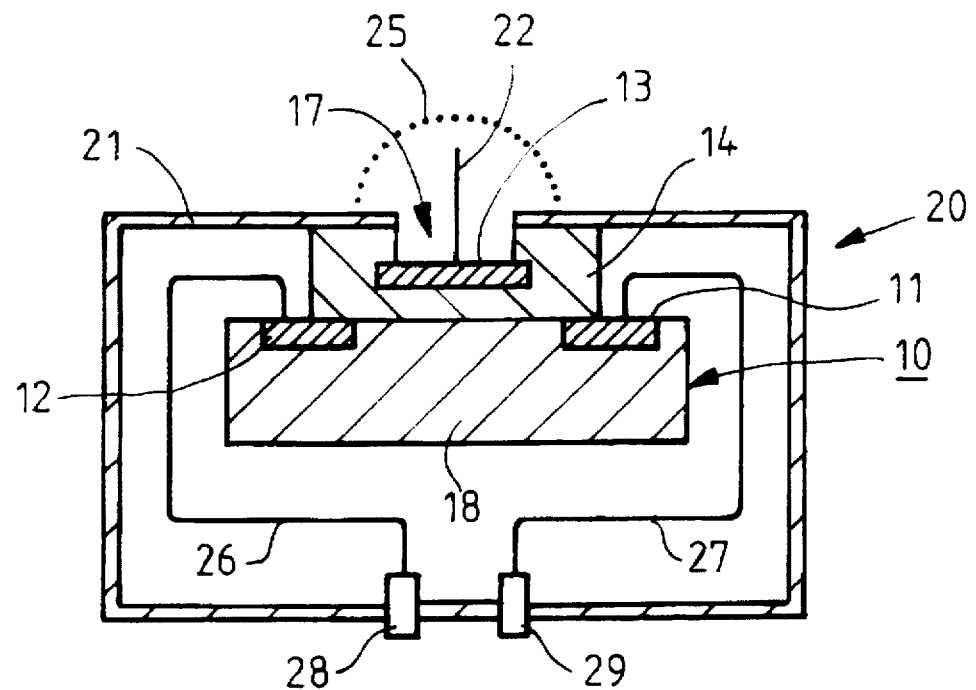

FIG. 5 shows a detector comprised principally of a MOSFET transistor 10 mounted in a casing 20. A hole is formed in the wall 21 of the casing 20 at the same point as the hole 17 formed in the oxide layer insulator 14 of the floating gate 13 of the transistor 10, which means that the gate 13 is in direct contact with the surrounding air space. If the transistor 10 is exposed to ionizing radiation, the charge on the gate 13 forms an electric field which attracts the ions formed in the air space due to radiation.

In the detector shown in FIG. 5, a conductor 22, which enables more effective collection of ions, has also been connected to the floating gate 13. It is protected by a net 25 incorporated in the casing 20, the net at the same time covering the hole 17 in the oxide layer of the gate insulator 14. In order that a voltage could be applied between the source 11 and the drain 12 and, correspondingly, that the decrease in the charge between them could be measured, the source 11 and the drain 12 are connected by means of conductors 26 and 27 to connectors 28 and 29, mounted in the wall 21 of the casing 20.

Figure 6:
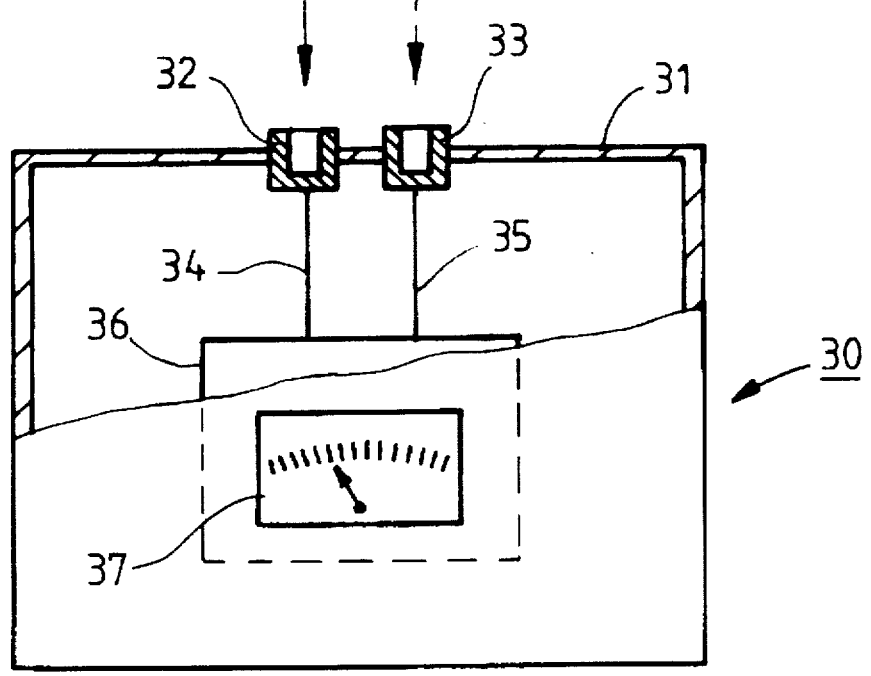

FIG. 6 shows a radiation readout device 30 which enables the reading of the radiation dose to which the detector of FIG. 5 is exposed. For reading to take place, the connectors 28 and 29 in the wall 21 of the casing 20 of the detector of FIG. 5 are pressed into the connectors 32 and 33 located in the wall 31 of the radiation readout device 30. These connectors 32 and 33 are further connected by means of conductors 34 and 35 to the measuring electronics unit 36 of the readout device 30. When the detector formed by the transistor 10 and the readout device 30 are connected to each other, the radiation dose can be read on the display unit 37.

Figure 7:
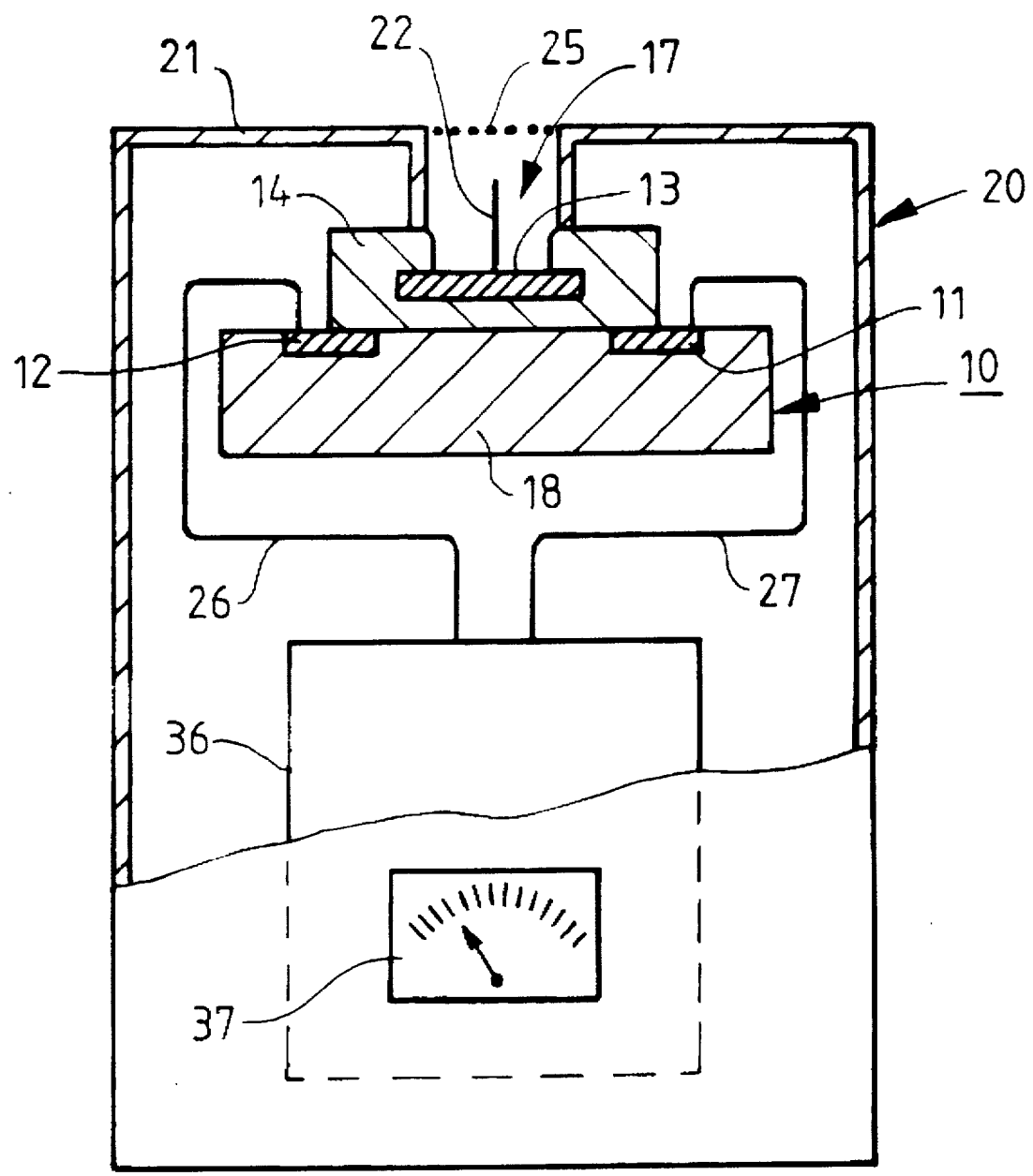

FIG. 7 shows a detector where the MOSFET transistor 10 and the measuring electronics unit 36 are located in the same casing 20. Since the measuring part 36, equipped with a power source, is connected by means of conductors 26 and 27 to the transistor 10, the radiation dose obtained can be read on the display unit 37 at any time.

Regarding the figures discussed above, it should be noted that their dimensions are not drawn to true scale. The MOSFET transistor, for example, is presented in considerably enlarged form in comparison to the rest of the equipment for reasons of clarity. In reality, the transistor may be made of very thin films.

The essential aspect of the invention is, however, that the radiation dose obtained can be determined from the change in the charge on the MOSFET transistor's gate. The radiation dose can also be measured at any time without having to discharge the gate. Such a passive mode of use is economical, because the detector need not comprise a power source.

The invention uses gas as a medium and this may even result in excessive sensitivity, if the gas space used is large. The gate is charged to a known state of charge, in which case, in the presence of radiation, the charge on the gate creates an electric field in the gas, due to the effect of which the gate collects the ions formed in the gas. The casing or the net protects from interference and increases ionization as the solid matter corresponds to a thick layer of air.

In the detector relating to the invention, it is not necessary to form an electric field between the floating gate and the plate located in front of it. Known detectors use live gates. By placing the MOSFET transistor so that its gate is in direct contact with or otherwise exposed to gas, such as the surrounding air, there will be nothing in between that would essentially prevent the passage of charges.

It is obvious to a person skilled in the art that the different embodiments of the invention may vary within the scope of the claims presented below.

I claim:

1. A method for detecting ionizing radiation comprising:
    providing a MOSFET transistor which includes a floating gate having an electrically non-insulated surface,
    arranging said electrically non-insulated surface of said MOSFET transistor in a space containing air or gas,
    forming a desired charge on said floating gate of said MOSFET transistor,
    exposing the air or gas space to ionizing radiation whereby the charge on said floating gate is changed,
    determining the change in the charge of the floating gate,
    and determining the radiation dose based on the change in the charge on the floating gate.

2. A method as claimed in claim 1 wherein said electrically non-insulated surface of the floating gate is uncovered.

3. A method as claimed in claim 1 wherein said electrically non-insulated surface of the floating gate is covered with a conductor or semiconductor.

4. A method as claimed in claim 1, wherein the air or gas space is exposed to the ionizing radiation through a solid plate.

5. A method as claimed in claim 1, wherein the change in the charge on the floating gate depends on the gas in said air or gas space and the gas pressure.

6. A method as claimed in claim 1 wherein said air or gas space is surrounded by a wall material.

7. A method as claimed in claim 6 wherein a volume of the gas in the air or gas space, gas pressure and the wall material are selected so as the be tissue-equivalent.

8. A dosimeter comprising a MOSFET transistor, said transistor comprising:
    a silicon substrate 18;
    a source 11 and a drain 12 provided on the substrate 18;
    an oxide layer 14 provided on the substrate 18 and covering at least a portion of the source 11 and the drain 12;
    a floating gate 13 provided in the oxide layer 14, said oxide layer being open at a top thereof such that at least a portion of the surface of the floating gate 13 is electrically non-insulated and is surrounded by the oxide layer 14.

9. A dosimeter as claimed in claim 8, wherein said electrically non-insulated surface of the floating gate 13 is uncovered.

10. A dosimeter as claimed in claim 8, wherein said electrically non-insulated surface of the floating gate 13 is covered with a conductor or semi-conductor.

11. A dosimeter as claimed in claim 8, wherein said electrically non-insulated surface of the floating gate 13 is surrounded by a wall which forms an air or gas space.

12. A dosimeter as claimed in claim 11, wherein a solid plate is situated in front of an opening of said air or gas space.

13. A dosimeter as claimed in claim 8, wherein the dosimeter is located in a casing, connectors are fastened to a wall of the casing and said connectors are connected to the source and drain of the MOSFET transistor.

14. A dosimeter as claimed in claim 8, wherein the dosimeter further comprises a radiation readout device having connectors that can be connected to the dosimeter to enable the charge on the floating gate of the MOSFET transistor to be determined.

15. A dosimeter as claimed in claim 8, wherein the dosimeter further comprises a measuring electronics unit for reading a charge on the floating gate.

* * * * *